(12) United States Patent
Faulkner et al.

(10) Patent No.: US 9,888,526 B2
(45) Date of Patent: Feb. 6, 2018

(54) DETECTING HEATER FAILURE IN A GROUP OF ELECTRIC HEATERS IN A PROCESS EQUIPMENT HEATING SYSTEM

(71) Applicant: EDWARDS VACUUM LLC, Sanbom, NY (US)

(72) Inventors: Budd Edward Faulkner, Hillsboro, OR (US); Peter George Stammers, Eastbourne (GB); Brett Trevor Lawrence, Bexhill on Sea (GB); Craig Richard Charles Turner, Heathfield (GB); Brent Haslett, Bexhill on Sea (GB); Nicholas Daniel Hutton, Eastbourne (GB); Matthew Demian Klepp, Portland, OR (US); Mark Kollin Romeo, North Plains, OR (US)

(73) Assignee: Edwards Vacuum LLC, Sandom, NY (US)

( * ) Notice: Subject to any disclaimer, the term of this patent is extended or adjusted under 35 U.S.C. 154(b) by 31 days.

(21) Appl. No.: 14/813,261

(22) Filed: Jul. 30, 2015

(65) Prior Publication Data

US 2017/0034874 A1 Feb. 2, 2017

(51) Int. Cl.
*H05B 1/02* (2006.01)
*H05B 3/02* (2006.01)
*G01R 31/00* (2006.01)
*H01L 21/00* (2006.01)

(52) U.S. Cl.
CPC .......... *H05B 1/0202* (2013.01); *G01R 31/00* (2013.01); *H01L 21/00* (2013.01); *H05B 1/0233* (2013.01); *H05B 3/02* (2013.01)

(58) Field of Classification Search
CPC ...... H05B 1/0202; H05B 1/0233; H05B 3/02; G01R 31/00; G05B 1/00; H01L 21/00
USPC ............... 219/505, 481, 483, 486, 506, 497
See application file for complete search history.

(56) References Cited

U.S. PATENT DOCUMENTS

| | | | | | |
|---|---|---|---|---|---|
| 4,036,457 | A | * | 7/1977 | Volkner | G05D 23/1905 219/202 |
| 4,559,441 | A | * | 12/1985 | Rudich, Jr. | G05D 23/1912 219/483 |
| 4,996,487 | A | * | 2/1991 | McSparran | B41J 2/0451 219/506 |
| 5,280,422 | A | * | 1/1994 | Moe | B29C 45/2737 219/486 |
| 5,841,617 | A | * | 11/1998 | Watkins, Jr. | H02H 5/043 219/494 |
| 6,766,220 | B2 | * | 7/2004 | McRae | A61M 11/041 128/200.14 |

(Continued)

OTHER PUBLICATIONS

Edwards Limited (2013), TMS Temperature Management System Instruction Manual, Issue E, pp. 1-72, Crawley, United Kingdom.

*Primary Examiner* — Mark Paschall

(57) ABSTRACT

A process equipment heating system has a group of electric heaters and a heater checking system. The heater checking system is configured to determine a resistance value $R_1$ for the group of electric heaters, compare the resistance value $R_1$ with a reference resistance value $R_R$ and judge a fault condition if the resistance value $R_1$ differs from the reference resistance value $R_R$ by more than a predetermined amount.

6 Claims, 6 Drawing Sheets

(56) References Cited

U.S. PATENT DOCUMENTS

| | | | | |
|---|---|---|---|---|
| 7,196,295 B2 * | 3/2007 | Fennewald | ......... | B29C 45/2737 |
| | | | | 219/212 |
| 7,615,726 B2 * | 11/2009 | Shah | ..................... | F24H 3/0405 |
| | | | | 219/486 |
| 2011/0290784 A1 * | 12/2011 | Orawetz | ................ | B64D 15/12 |
| | | | | 219/486 |

* cited by examiner

DETECTING HEATER FAILURE IN A GROUP OF ELECTRIC HEATERS IN A PROCESS EQUIPMENT HEATING SYSTEM

FIELD OF THE INVENTION

The invention is directed to detecting heater failure in a group of electric heaters in a process equipment heating system.

BACKGROUND

Many industrial processes require the use of pipes to convey fluids between fluid reservoirs, machines, processing devices and the like. Control of the temperature within the pipe may be desirable. This may be to ensure that the fluids conveyed are maintained in a particular state. For example, processes used in the manufacture of semiconductors may involve the use of gases that can become dangerous if allowed to condense in the pipes through which they are conveyed. Explosion hazards, corrosive media and other such hazards may exist if such gases are allowed to condense on the pipe walls. Pipes may be provided with electric heaters to warm the pipe walls to prevent condensation of the conveyed gases. Often numerous electric heaters are provided along a length of pipe in which case, it may be troublesome monitoring the condition of the electric heaters.

Other objects, aspects and advantages of this invention will be apparent to one skilled in the art in view of the following disclosure, the drawings, and the appended claims.

SUMMARY OF THE INVENTION

The summary of the invention is intended to introduce the reader to various exemplary aspects of the invention. Particular aspects of the invention are shown in other sections herein below, and the invention is set forth in the appended claims, which alone demarcate its scope.

In accordance with an exemplary embodiment of the invention a method of detecting heater failure in a group of electric heaters in a process equipment heating system, said method comprising operating a heating system controller to:
(a) determine a resistance value $R_1$ for said group of electric heaters;
(b) compare said resistance value $R_1$ with a reference resistance value $R_R$; and
(c) judge a fault condition if said resistance value $R_1$ differs from said reference resistance value $R_R$ by more than a predetermined amount.

An additional aspect of the invention provides a process equipment heating system comprising:
(a) a group of electric heaters; and
(b) a heater checking system configured to determine a resistance value $R_1$ for said group of electric heaters, compare said resistance value $R_1$ with a reference resistance value $R_R$ and judge a fault condition if said resistance value $R_1$ differs from said reference resistance value $R_R$ by more than a predetermined amount.

A further aspect of the invention provides a non-transitory computer readable medium comprising instructions for operating a process equipment heating system controller stored thereon that when executed on a processor cause performance of the following steps:
(a) obtention of a resistance value $R_1$ for group of electric heaters controlled by said heating system controller;
(b) comparing of said resistance value $R_1$ with a reference resistance value $R_R$; and
(c) judging of a fault condition if said resistance value $R_1$ differs from said reference resistance value $R_R$ by more than a predetermined amount.

Another aspect of the invention provides a process equipment heating system upgrade kit comprising:
(A) a non-transitory computer readable medium comprising instructions for operating a process equipment heating system controller stored thereon that when executed on a processor cause performance of the following steps:
(a) obtention of a resistance value $R_1$ for group of electric heaters controlled by said heating system controller,
(b) comparing of said resistance value $R_1$ with a reference resistance value $R_R$, and
(c) judging of a fault condition if said resistance value $R_1$ differs from said reference resistance value $R_R$ by more than a predetermined amount; and
(B) at least one transducer to provide measurements to be used in obtention of said resistance value $R_1$.

A still further aspect of the invention provides a method of operating a process equipment heating system, said method comprising operating a heating system controller to:
(a) determine whether a group of electric heaters has a fault; and
(b) when it is determined that said group of electric heaters has a fault,
  i) generate an alert indicating that said group of electric heaters has a fault, and
  ii) maintain a supply a supply of said electrical energy to said group of electric heaters whereby each electric heater of said group of electric heaters can continue to provide heat until a human intervention, a respective temperature sensitive device is exposed to a temperature that causes it to interrupt said supply of electric energy the electric heater or the electric heater fails.

Yet another aspect of the invention provides a process equipment heating system comprising:
(a) a group of electric heaters, each electric heater of the group having at least one temperature sensitive device operable to interrupt an electrical energy supply path through the electric heater if exposed to a temperature exceeding a predetermined temperature; and
(b) a controller configured to:
(i) determine whether said group of electric heaters has a fault; and
(ii) when it is determined that said group of electric has a fault generate an alert indicating that said group of electric heaters has a fault and maintain a supply of said electrical energy to said group of electric heaters.

While multiple embodiments are disclosed, still other embodiments of the present invention will become apparent to those skilled in the art from the following detailed description, which shows and describes illustrative embodiments of the invention. Accordingly, the detailed description is to be regarded as illustrative in nature and not restrictive.

BRIEF DESCRIPTION OF THE DRAWINGS

In the following disclosure, reference will be made to the drawings, in which.

DETAILED DESCRIPTION OF THE PREFERRED EMBODIMENTS

So that the invention may be readily understood, certain terms are first defined. It should be noted that, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Many modifications and variations of the invention as hereinbefore set forth can be made without departing from the spirit and scope thereof, and, therefore, only such limitations should be imposed as are indicated by the appended claims.

Figure 1:
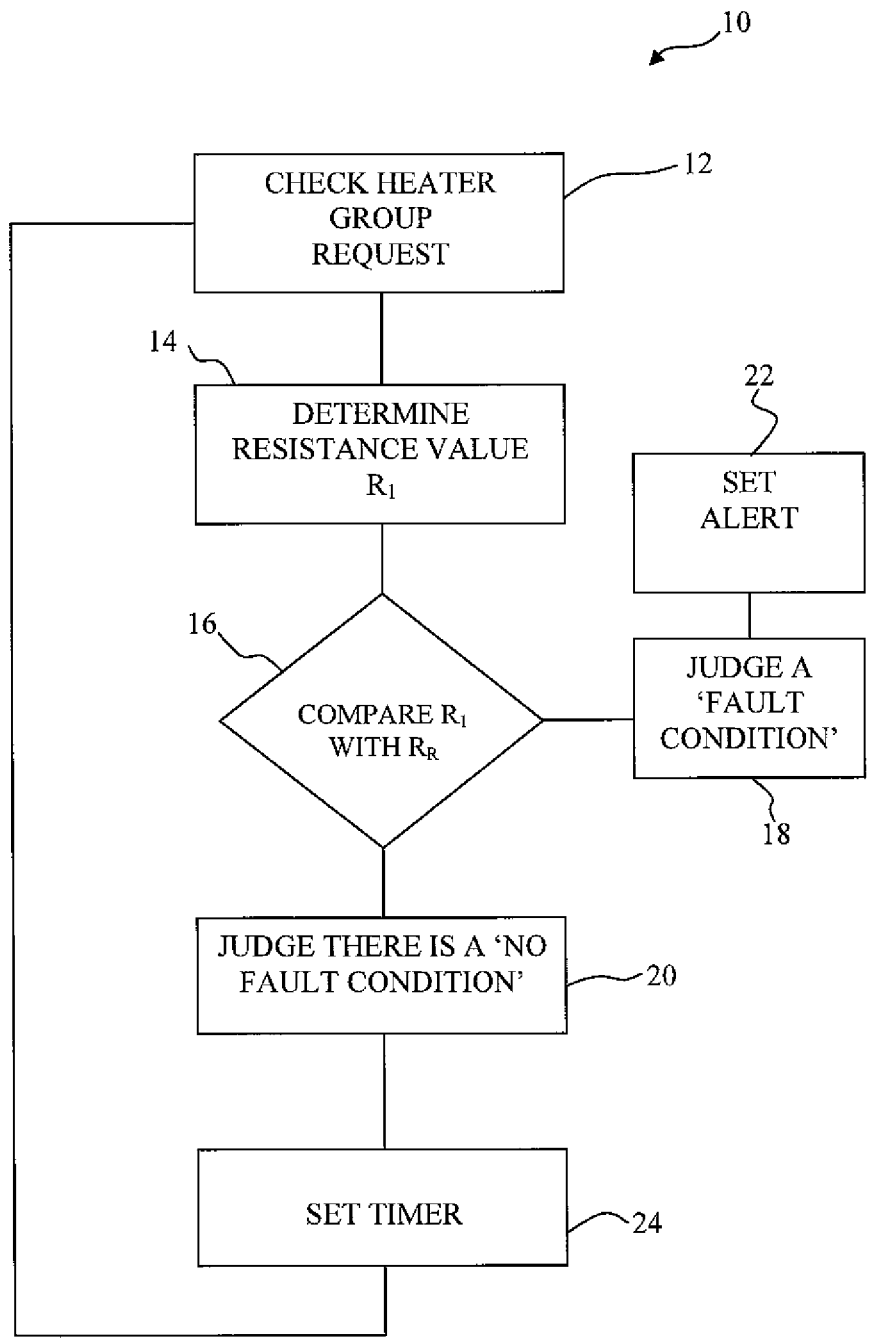
FIG. 1 is a flow diagram illustrating an embodiment of a method of detecting heater failure in a group of electric heaters in a process equipment heating system.

Referring to FIG. 1, a method 10 of detecting heater failure in a group of electric heaters in a process equipment heating system may include initiating a checking process by making a check heater group request 12. This may initiate a checking process that may comprise determining 14 a resistance value $R_1$ for the group of electric heaters, comparing 16 the resistance value $R_1$ with a reference resistance value $R_R$ and judging 18 that there is a 'fault condition' if the resistance value $R_1$ differs from the reference resistance value $R_R$ by more than a predetermined amount. If the resistance value $R_1$ does not differ from the reference resistance value by more than the predetermined amount, it is judged 20 that there is a 'no fault condition'. If the judgment is that there is a fault condition, an alert is set 22 to alert a human operator that a fault has been detected in the group of electric heaters. The human operator is then aware that there is a problem and can arrange for the group of electric heaters to be inspected to determine which heater in the group has caused the fault condition so that it can be repaired or replaced. If the judgment is that there is no fault condition, a timer may be set 24 to initiate a new check heater group request 12 after a set interval, for example thirty minutes.

Determining the resistance value $R_1$ may comprise obtaining one or more of an amperage, resistance, voltage or wattage measurement for the group of electric heaters. For example, a resistance transducer may be used to obtain a measurement of the resistance of the group of electric heaters that can be compared directly with the reference resistance value $R_R$. Alternatively, amperage and voltage measurements may be obtained and the resistance value $R_1$ derived from those measurements by, for example, using the formula $$R=V/I$$

where R is resistance, V is voltage and I is current (amperage). Another alternative may comprise obtaining a wattage measurement and a voltage or amperage measurement for the group of electric heaters and using the power equation $$P=VI$$

where P is power, V is voltage and I is current (amperage). For example, by substituting IR=V into the power equation the relationship $$R=P/I^2$$

is obtained so that measurements of amperage and wattage can be used to determine the resistance value $R_1$. Alternatively, by substituting V/R=I into the power equation the relationship $$R=V^2/P$$

is obtained so that measurements of voltage and wattage can be used to determine the resistance value $R_1$.

In embodiments in which measurements of amperage, voltage or wattage are obtained to derive a resistance value $R_1$, the resistance value may be obtained by a programmed calculation or by using a lookup table stored in a memory.

In some embodiments, there may be multiple groups of electric heaters that are powered from the same power supply or the same phase of a multi-phase power supply. When obtaining amperage, voltage or wattage measurements from a particular group of electric heaters, the supply to the other commonly supplied groups of electric heaters may be interrupted so that the power supply, or a particular phase of the power supply, is supplying only the group of electric heaters for which the measurements are being obtained. If this is done, the measurements obtained for the group of electric heaters that is being checked should not be influenced by the condition of the other groups of electric heaters. In embodiments in which a resistance transducer is used to obtain a resistance measurement for a group of electric heaters, the power supply to the group of electric heaters should be interrupted and an alternative power supply suitable for use with the resistance transducer switched in. The alternative supply may be a DC supply tapped from a system controller or integral with the resistance transducer.

In some embodiments the latest resistance value $R_1$ may be stored for use as the reference resistance $R_R$ value for a future checking process or processes. For example, in embodiments in which the reference resistance value $R_R$ is stored in an electronic memory, the stored reference resistance value $R_R$ may be overwritten by the resistance value $R_1$ to obtain an updated, or new, reference resistance value.

Figure 2:
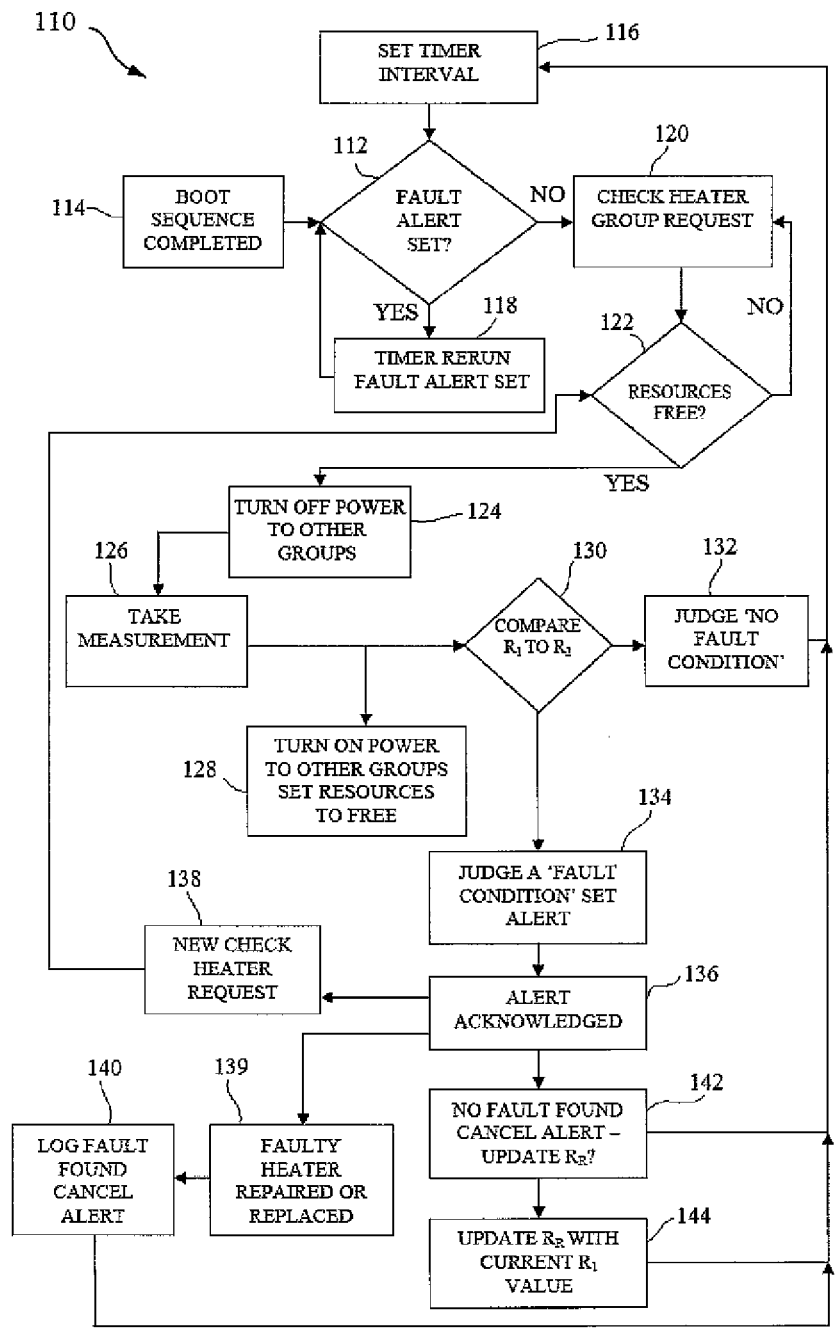
FIG. 2 is a flow diagram illustrating another embodiment of a method of detecting heater failure in a group of electric heaters in a process equipment heating system.

Referring to FIG. 2, another embodiment of a method 110 of detecting heater failure in a group of electric heaters will be described as applied to a process equipment heating system that comprises a plurality of groups of electric heaters, each group comprising at least two electric heaters. In the context of this description of the method illustrated by FIG. 2, reference is made to a subject group of electric heaters. It is to be understood that this is terminology is used purely for identification purposes to differentiate the particular group of electric heaters that is being checked and may be applied to any of the groups of electric heaters when a particular one is being checked.

The method 110 may comprise identifying a subject group of electric heaters to be checked and checking 112 whether a fault alert has already been set for that group of electric heaters. This check 112 may follow the completion of a boot sequence 114 of a heating system controller or the elapse of a set timer interval 116, which may be set the last time the method 110 was applied to the subject group of electric heaters. If it is found that there is a fault alert already set for the subject group of electric heaters, a timer may be set 118 to trigger a rerun of the check 112 after the elapse of a predetermined interval, for example, ten minutes.

If the check 112 determines that there is no current fault alert set for the subject group of electric heaters, a check heater group check request 120 may be set and a check 122 made to determine whether resources are available to carry out the heater group check. If it is determined that resources are not currently available, the check 122 may be repeated at set intervals until resources are available.

If the check 122 establishes that resources are available to carry out a heater group check, a command 124 is given to interrupt the supply of electricity to all groups of electric heaters that are commonly supplied so that the condition of the other groups of electric heaters will not influence the result of the check carried out on the subject group of electric heaters. In embodiments in which the groups of electric heaters are powered by a three phase power supply, only the or each group of electric heaters supplied by the same phase as the subject group need be isolated from the power supply. Then a measurement, or measurements, 126 may be obtained for the subject group of electric heaters and used to determine a resistance value $R_1$ for the subject group of electric heaters. When the measurement, or measurements, has been obtained, a command 128 may be given to reconnect all groups of electric heaters to the power supply and set a flag indicating that resources are available to commence a check on another group of electric heaters.

The resistance value $R_1$ for the subject group of electric heaters is compared 130 with a reference resistance value $R_R$. If the resistance value $R_1$ is the same as the reference resistance value $R_R$, or does not differ from the reference resistance value $R_R$ by more than a predetermined amount, it is judged 132 that there is a 'no fault condition'. A timer interval 116 may be set to cause the initiation of a new check after a set interval, for example, thirty minutes.

If the resistance value $R_1$ differs from the reference resistance value $R_R$ by more than the predetermined amount, it is judged 134 that there is a fault condition in the subject group of electric heaters and an alert is set to bring this to the attention of a human operator. The alert may take the form of visual alert, an audible alert or both. A visual alert may comprise switching a light associated with the group of electric heaters or providing a fault indication on a display screen.

The alert may be provided at a station that comprises a human I/O interface that allows the human operator to acknowledge the alert 136. Before initiating a physical check of the subject group of electric heaters, the human operator may initiate a new check heater group request 138 for the subject group of electric heaters. This manually commanded new check heater group request 138 may override any set timer interval 116 for another group of electric heaters. On receiving the result of the check carried out in response to the new check heater group request 138, the human operator may decide to ignore the earlier fault condition alert if the new heater check request 138 determines a no fault condition. In this case, the human operator may cancel the alert 142 and set a new timer interval 116.

Alternatively, the human operator may immediately initiate a physical check of the subject group of electric heaters. If a physical check of the group of electric heaters reveals that one or more of the electric heaters is faulty, following repair of replacement 139, the human operator may cancel the alert, input 140 an indication that a fault was found and the action taken for saving in a log and set a timer interval 116 for initiating a new check heater group request 120. In some embodiments (not shown), the human operator may initiate a new check heater request overrides any set timer interval for another group of electric heaters, or sits in a queue, and may be used to establish that the checking system recognizes that the electric heaters of the subject group of electric heaters is healthy or to establish a new reference resistance value $R_R$ for the subject group of electric heaters.

If the human operator initiates a physical check of the subject group of electric heaters and this establishes that none of the electric heaters is faulty, the human operator may elect to update the reference resistance value $R_R$ by making the resistance value $R_1$ the new, or updated, reference resistance value $R_R$ for the group. In this case, the human operator may input 142 an indication that no fault was found so that this can we written in a log, cancel the alert and command 144 that the reference resistance value $R_R$ is updated. Then a timer interval may be set 116 to initiate the next heater group check request 120 for the group of electric heaters. It will be understood that in a process equipment heating system comprising multiple groups of electric heaters, the method 110 may be repeated sequentially so that each of the groups of electric heaters is periodically checked.

Figure 3:
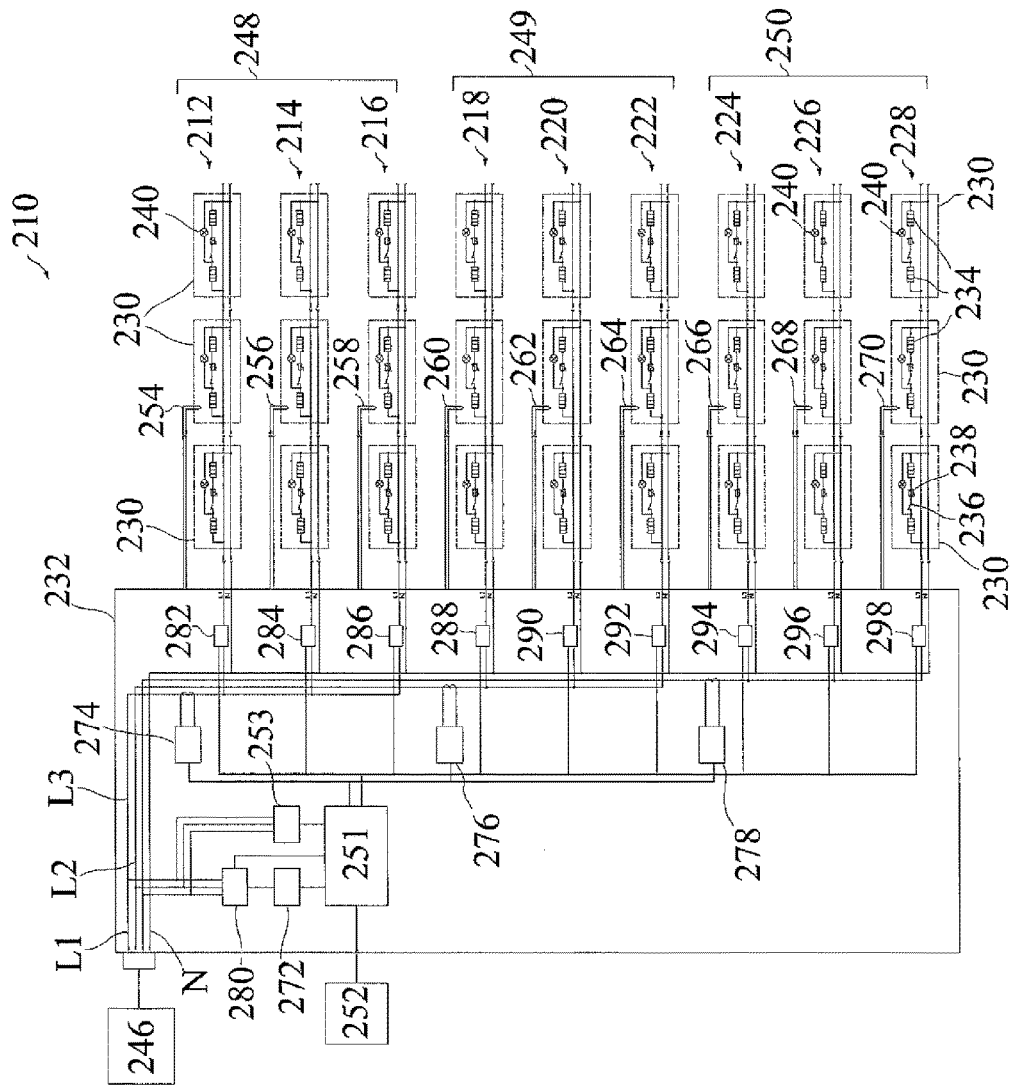
FIG. 3 is a schematic representation of an embodiment of a process equipment heating system.

Referring to FIG. 3, an embodiment of a process equipment heating system 210 comprises a plurality of groups of electric heaters 212-228, each comprising a plurality of electric heaters 230. The process equipment heating system 210 further comprises a checking system that may be a part of a heating system controller 232. The checking system is configured to determine a resistance value $R_1$ for a subject one of the groups of electric heaters 212-228, compare the resistance value $R_1$ with a reference resistance value $R_R$ for that group of electric heaters and judge a fault condition if the resistance value $R_1$ differs from the reference resistance value $R_R$ by more than a predetermined amount.

The groups of electric heaters 212-228 each comprise two or more electric heaters 230 that are connected electrically in parallel so that if one heater in the group fails, the others can continue to function. While not limited to these numbers, the groups of electric heaters 212-228 may each comprise twenty to thirty electric heaters 230. Although not essential, a group of electric heaters 212-228 may be arranged so that the heaters in a group are disposed in relatively close proximity to one another to heat pipes, valves and the like in a particular zone of a processing system such as in a semiconductor manufacturing facility. A group of electric heaters may, for example, be used to heat a 10 meter length of 40 mm diameter pipe of a processing system. The electric heaters 230 may be configured to be secured to pipes, valves and the like and may be secured to the part by any suitable known means. In some embodiments the electric heaters 230 may be secured to a pipe, valve or the like by securing strap systems as disclosed by the Applicant's copending U.S. patent application Ser. No. 14/813,223, the entire content of which is incorporated herein by reference.

Figure 4:
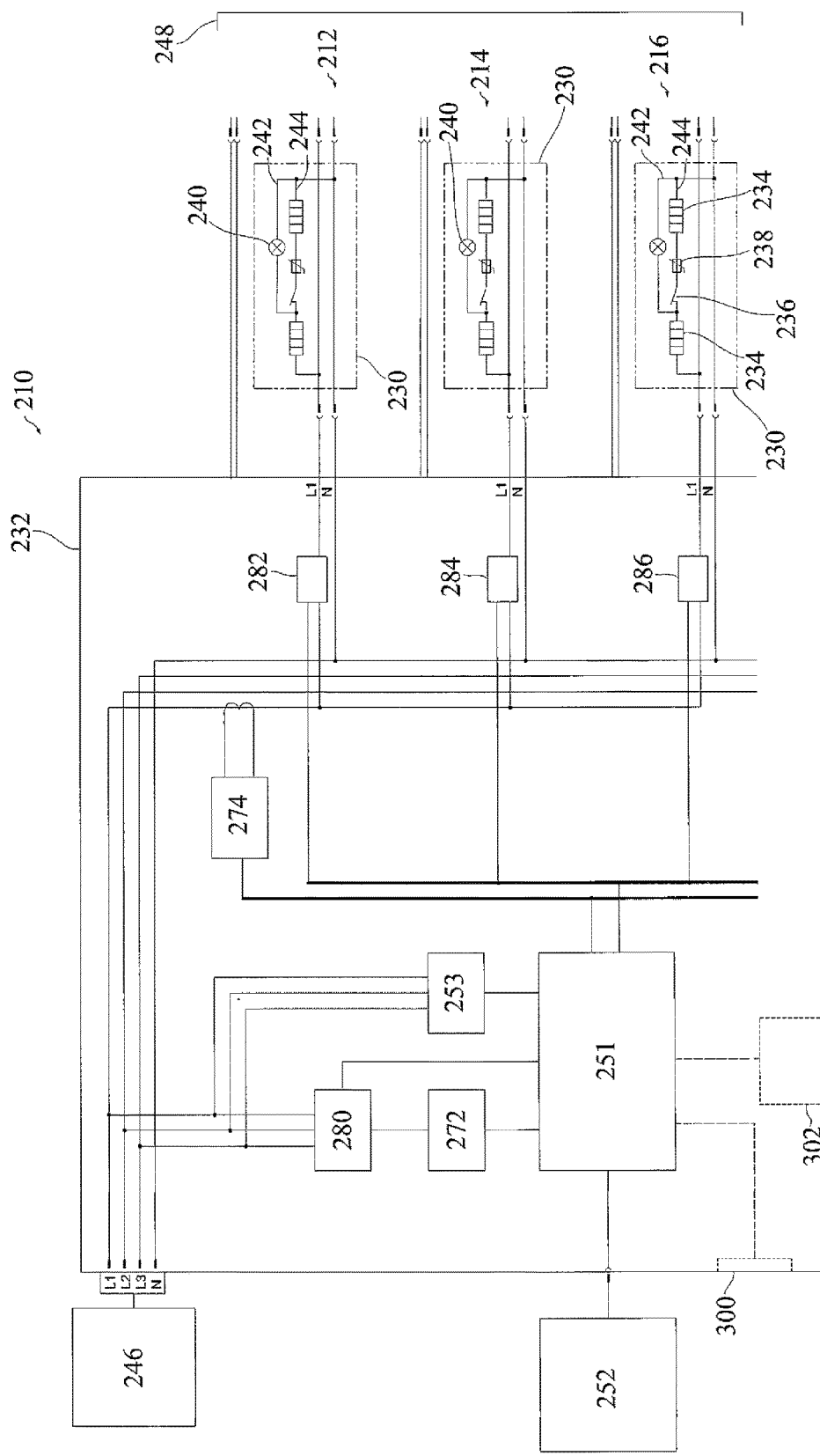
FIG. 4 is an enlargement of a portion of FIG. 3 also showing some additional, optional, features of the process equipment heating system.

As best seen in FIG. 4, the electric heaters 230 may each comprise at least one resistance heating element 234. The electric heaters 230 may each be provided with at least one temperature sensitive device 236, 238 operable to interrupt the supply of electrical energy through the heating element, or heating elements, when exposed to a temperature exceeding a set temperature. In the illustrated embodiment, each electric heater 230 is provided with two temperature sensitive devices 236, 238 arranged in series with two heating elements 234 and comprising a temperature sensitive switch 236 and a thermal fuse 238. Each electric heater 230 may additionally be provided with at least an element of a fault indicating device 240. The fault indicating device 240 may be provided in a circuit branch 242 that is electrically in parallel with a circuit branch 244 containing the heating elements 234 and temperature sensitive devices 236, 238. The relative resistances $R_2$, $R_3$ of the two branches 242, 244 may be such that, in use, when the temperature sensitive devices 236, 238 operate to allow electrical energy to flow through the branch 244, the fault indicating device 240 is inactive and when one of the temperature sensitive devices 236, 238 operates to interrupt the electrical energy flow through the branch 244, the fault indicating device 240 activates to indicate that that a temperature sensitive device has operated to interrupt the supply of electrical energy to the electric heater 230. As disclosed in the Applicant's copending U.S. patent application Ser. No.14/813,251, the entire content of which is incorporated herein by reference, the activation of the fault indicating device 240 may provide a convenient way of identifying a faulty electric heater 230 amongst a group of electric heaters, especially if some are disposed in difficult to access locations. The fault indicating devices 240 may provide at least one of an audible and visual indication. The fault indicating devices 240 may comprise a lighting element.

The heating system controller 232 is configured to be connected with a mains electrical power supply 246 to control the supply of electrical power to the groups of electric heaters 212-228. As illustrated in FIG. 3, the mains electrical power supply 246 may be a three-phase power supply. While not essential, the illustrated embodiment has nine groups of electric heaters 212-228. The groups of electric heaters 212, 214, 216 represent a first set 248 of groups of electric heaters and are powered by phase L1 of the three-phase power supply. The groups of electric heaters 218, 220, 222 represent a second set 249 of groups of electric heaters and are powered by phase L2 of the three-phase power supply. The groups of electric heaters 224, 226, 228 represent a third set 250 of groups of electric heaters and are powered by phase L3 of the three-phase power supply.

The heating system controller 232 may be processor-based and may, for example, comprise a programmable logic controller (PLC) 251. The heating system controller 232 may comprise a human I/O interface 252. The human I/O interface 252 may comprise a keypad and a display screen and be configured to display alerts and other messages to be read by a human operator and enable a human operator to, for example, enter commands, data and cancel alerts and other messages shown on the display.

The heating system controller 232 may comprise an AC-DC power supply unit 253 connected with the phases L1, L2, L3 to provide a DC power supply for the PLC 251, human I/O interface 252 and other elements in the heating system controller that require DC power.

As shown in FIG. 3, the heating system controller 232 is connected with respective temperature sensing transducers 254-270 that provide signals indicative of the temperature of the respective zones the electric heater groups 212-228 are used to heat. The signals from the temperature sensing transducers 254-270 are communicated to the PLC 251. The signals may be communicated via a signal conditioning system (not shown) external to the PLC 251, which may comprise an A-D converter. Alternatively, the PLC 251 may have an onboard signal conditioning capability. The temperature sensing transducers 254-270 may comprise any suitable transducer, such as RTDs, thermistors and thermocouples.

The PLC 251 is configured to implement program instructions in response to signals received from the temperature sensing transducers 254-270. For example, the PLC 251 may cause the power supply to a group of electric heaters 212-228 to be adjusted in order to maintain a target temperature for the zone heated by that group of electric heaters. The PLC 251 may also implement program instructions to judge a fault condition for a group of electric heaters 212-228 if the temperature indication provided by the respective temperature sensing transducer 254-270 is above or below a particular threshold, especially if in an embodiment in which the PLC is configured to adjust the power supply to maintain a target temperature, there is no response to adjustment of the power supply.

The heating system controller 232 is provided with a checking system configured to determine a resistance value $R_1$ for a group of electric heaters 212-228, compare the resistance value $R_1$ with a reference resistance value $R_R$ and judge a fault condition if the resistance value $R_1$ differs from the reference resistance value $R_R$ by more than a predetermined amount. In the illustrated embodiment, the checking system comprises program instructions implemented by the PLC 251, a voltage sensing transducer 272 and respective amperage (current) sensing transducers 274-278 for the three phases L1, L2, L3.

The voltage sensing transducer 272 is connected with the PLC 251 to provide signals indicative of the voltage supplied to a group of heaters 212-228 that is being checked. In embodiments, such as the illustrated embodiment, in which there is a multi-phase power supply, a phase selector 280 may be connected between the voltage sensing transducer 272 and the phases L1, L2, L3 of the power supply. The phase selector 280 may be connected with and controlled by the PLC 251. In response to control signals from the PLC 251, the phase selector 280 is operable to connect the voltage sensing transducer 272 with the phase L1, L2, L3 that supplies the group of electric heaters 212-228 that is to be the subject of a check.

The amperage sensing transducers 274-278 are connected with the respective phases L1, L2, L3 supplying three sets 248-250 of groups of electric heaters 212-228 so that each can be used to sense the current being supplied to any of the three groups of electric heaters in the respective sets. The groups of electric heaters 212-228 are connected to the supply phase L1, L2, L3 from which they are supplied with electrical energy by respective switching relays 282-298. The switching relays 282-298 are connected with the PLC 251 so as to be operable to selectively isolate the respective groups of electric heaters 212-228 from the electric power supply in response to control signals from the PLC. By suitable operation of the switching relays 282-298, the groups of electric heaters 212-228 connected with a particular phase L1, L2, L3 can be selectively isolated from the supplying phase such that only the group of electric heaters that is to be checked is being powered by the particular phase. Thus, for example, if the group of electric heaters 212 is to be checked, the phase selector 280 is caused to connect the voltage sensing transducer 272 with phase L1 and the switching relays 284, 286 are caused to isolate the groups of electric heaters 214, 216 from the phase L1 so that signals indicative of the voltage and amperage supplied to the group of electric heaters 212 can be obtained under conditions in which the performance of the groups of electric heaters 214, 216 will not influence the measurements obtained. Once the required measurements have been obtained, the switching relays 284, 286 can be caused to reconnect the groups of electric heaters 214, 216 with phase L1. The groups of electric heaters 218-228 can be supplied normally by phases L2, L3 during this process. Similarly, if the group of electric heaters 228 is to be checked, the phase selector 280 is caused to connect the voltage sensing transducer 272 with phase L3 and the switching relays 294, 296 are caused to isolate the groups of electric heaters 224, 226 from phase L3 while the voltage sensing transducer 272 and amperage sensing transducer 278 provide signals indicative of the voltage and current being supplied to the group of electric heaters 228. Once the required measurements have been obtained, the switching relays 294, 296 can be caused to reconnect the groups of electric heaters 224, 226 with phase L3.

By loading suitable program instructions to the PLC 251, the heating system controller 232 can be configured to implement either of the methods disclosed herein. The heating system controller 232 shown in FIGS. 3 and 4 has amperage and voltage sensing transducers so that the resistance value $R_1$ can be determined using the relationship $$R=V/I$$

where V is an indication of voltage provided by the voltage transducer 272 and I is an indication of amperage provided by the appropriate amperage sensing transducer 274-278. In other embodiments, the voltage or amperage sensing transducers may be replaced by a wattage sensing transducer or wattage sensing transducers so that the resistance value can be determined using one of the relationships $$R=P/I^2$$

$$R=V^2/P$$

where V is an indication of voltage sensed by a voltage sensing transducer, I is an indication of amperage sensed by an amperage sensing transducer and P is an indication of wattage sensed by a wattage sensing transducer.

The program instructions and any required data may be loaded to the PLC 251 during assembly of the heating system controller 232. In some embodiments, the heating system controller may be provided with a input/output interface 300 (shown in dashed lines in FIG. 4) to allow the uploading of program instructions and data to the PLC and the downloading of data from logs stored in the PLC's memory capability. The interface 300 may, for example, comprise a USB port to allow uploading from/downloading to a memory stick or via a wired connection to another device. Additionally, or alternatively, the heating system controller 232 may comprise a communications unit 302 (shown in dashed lines in FIG. 4) configured to enable communications with a network device via a wired or wireless communications network. The network device may be configured to function as a master controller for a plurality of heating system controllers 232 and other elements of a processing system. In this description, reference has been made to a human operator viewing alerts and inputting commands via the human I/O interface 252 of a heating system controller 232. It is to be understood that this is not essential and that the human I/O interface may be at a network device so that the human operator does not have to be in the vicinity of, or interact directly with, the heating system controller.

It is to be understood that while it may be convenient to provide processing and memory capability in a heating system controller using a PLC, this is not essential. A heating system controller capable of implementing the methods disclosed herein may be provided by an assembly of components such as a processor, ROM, RAM and suitable interfacing or conditioning circuitry to facilitate communication between the processor and such switching devices, transducers and human interface devices as may be provided in the heating system controller.

The use of a multi-phase power supply allows the use of a relatively large number of electric heaters providing a relatively greater heating capacity. It is to be understood that for a smaller capacity process equipment, a single phase power supply may be used, in which case the phase selector shown in FIGS. 3 and 4 may be omitted.

Figure 5:
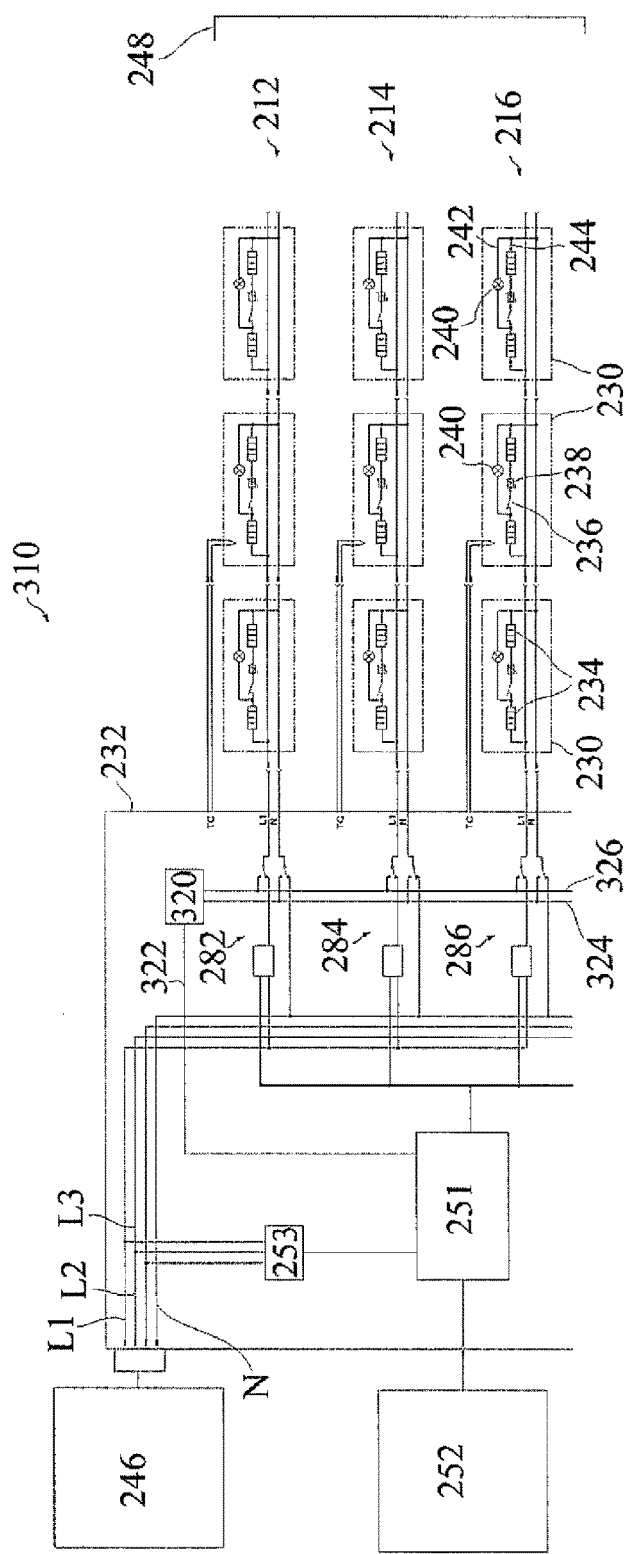
FIG. 5 is a view corresponding to FIG. 3 showing another embodiment of a process equipment heating system.

FIG. 5 is a view corresponding to FIG. 4 illustrating another embodiment of a process equipment heating system 310. Components of the process equipment heating system 310 the same as, or similar to, the components of the process equipment heating system 210 are identified by the same reference numeral and may not be described again. Although only the electric heater groups 21-216 are shown in the drawing, there are electric heater groups and switching relays to provide a total of nine electric heater groups and nine switching relays in similar fashion to the arrangement shown in FIG. 3.

The process equipment heating system 310 differs from the process equipment heating system 210 primarily in that the resistance value $R_1$ is determined using a resistance transducer 320 in place of the amperage, voltage and wattage sensing transducers described in connection with FIGS. 3 and 4. Since there is no voltage sensing transducer, the phase selector is omitted.

The resistance transducer 320 may incorporate a low voltage DC power supply and is connected with the PLC 251 by a conductor 322 to facilitate the transmission of signals indicative of the resistance of an electric heater group that is being checked. The switching relays 282-286 are double-pole relays operable to connect the respective groups of electric heaters 212-214 with the three phase supply 246 and conductors 324, 326 connected with the resistance transducer 320. In FIG. 5, the switching relays 282-286 are shown in a switched condition in which they connect the electric heater groups 212-216 with the phase L1 of the power supply 246.

In use, in the condition shown in FIG. 5, electrical energy is supplied from the phase L1 to the electric heater groups 212-216. When, for example, the electric heater group 212 is to be checked, the PLC 251 sends a signal to the switching relay 282 to cause the relay to switch to a condition in which the electric heater group 212 is isolated from phase L1 of the power supply and connected with the conductors 324, 326 to enable current flowing from the resistance transducer 320 to flow through the electric heater group 212 and the transducer to output a signal indicative of the resistance of the electric heater group to serve as the resistance value $R_1$. Once the PLC 251 has acquired a suitable signal, a control signal may be output to the switching relay 282 to cause it to disconnect the conductors 324, 326 and reconnect the electric heater group 212 with the phase L1 of the power supply 246. In similar fashion, when required, all of the other electric heater groups of the process equipment heating system can be disconnected from the respective phases L1, L2, L3 of the power supply 246 and connected with the resistance transducer 320 via the conductors 324, 326 to allow the obtention of respective resistance values $R_1$ in response to a command signal from the PLC 251. The resistance values $R_1$ obtained using the resistance transducer 320 may be compared with a reference resistance value $R_R$ to judge the condition of the groups of electric heaters using the methods described above.

The disclosed methods and systems make it possible to check on the condition of groups of electric heaters remotely, allowing the condition of many electric heaters of a process equipment heating system that may be distributed widely around a manufacturing facility to be monitored centrally and with a high degree of automation. Furthermore, since the disclosed methods and heating system controllers can be implemented using standard components, it is possible to provide heater group checking simply and economically. In embodiments in which the resistance values $R_1$ obtained by measurement are used to update the stored reference resistance value $R_R$ account can be taken of the changing condition of an electric heater group over time, for example, due to the removal of a particular electric heater or the addition of new electric heaters, whether as additional or replacement heaters.

Embodiments in which the resistance value $R_1$ is determined using readings of voltage divided by current avoids the problem of variations in the supply voltage affecting readings since current is proportional to voltage in a resistive load. Accordingly, in such embodiments it is not necessary to provide corrective measures to take account of supply voltage variations.

Embodiments in which the electric heaters are provided with respective fault indicating devices provide the possibility of increased efficiency. This is because a human operator is provided with an automated alert that there is a faulty electric heater in a particular electric heater group and when a physical check of the heater group is made, the human operator should be able to quickly see which electric heater is faulty based on an indication from the fault indicating device, which may be an illuminating device that is either lit or unlit when indicating a fault.

In some embodiments, there may be just one reference resistance value $R_R$ that is compared with the resistance value $R_1$ for each electric heater group. However, it is currently preferred that respective reference resistance values $R_R$ are stored and used for the groups of electric heaters as this allows for heater groups with different numbers, capacities and types of heater and should also provide more accurate results.

In the illustrated embodiments, the process equipment heating systems comprise multiple electric heater groups. It is to be understood that the disclosed methods and systems may be applied to embodiments in which there is just one electric heater group.

In the embodiments illustrated in FIGS. 3 and 4, there is one voltage transducer 272 and a phase selector 280 operable to selectively connect the voltage transducer to the three phases L1, L2, L3. In other embodiments there may be respective voltage transducers for the phases, in which case the phase selector may be dispensed with.

In the embodiments shown in FIGS. 3 and 4, there are respective amperage or wattage transducers 274, 276, 278 for the three phases L1, L2, L3. When a group of heaters supplied by a particular phase is to be checked, the other groups of heaters supplied from the same phase are isolated from the phase by switching, for example relays 282-298. While not essential, this ensures that the amperage or wattage sensed for a particular group of heaters by a transducer 274, 278, 278 is not influenced by the condition of the other groups of heaters supplied by the same phase. In other embodiments, this advantage may be obtained by providing respective amperage or wattage transducers for the groups of electric heaters 212-228. In such embodiments it is not necessary to isolate groups of heaters during the checking process and the switching may be dispensed with.

It is to be understood that the references to measurements does not necessarily mean that the signals provided by the transducers are conditioned or converted into actual measurements of amperage, resistance, voltage or wattage that might be displayed to a human operator and the methods and systems may simply make use of the relative values of the signals obtained.

Figure 6:
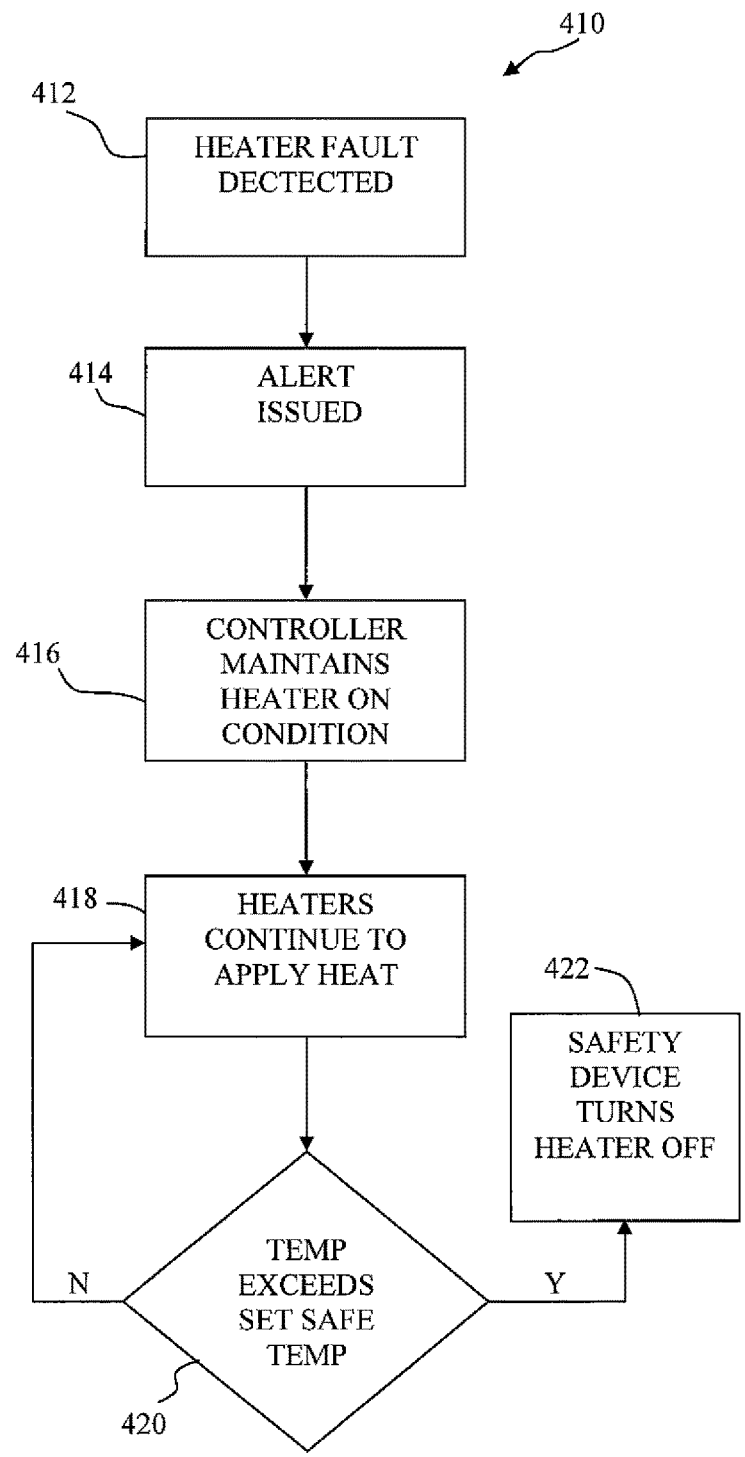
FIG. 6 is a flow diagram illustrating an embodiment of a method of operating a process equipment heating system.

When a check of an electric heater group indicates that there is a fault condition, in addition to providing an alert for a human operator, power to the electric heater group may be interrupted pending a check by a human operator and resetting of the heating system controller by the human operator. However, in some embodiments, if the resistance value $R_1$ differs the reference resistance value $R_R$ by an amount sufficient to cause the judging of a fault condition, but the difference is not greater than a second predetermined amount, it may be judged safe to maintain the supply of electric energy to the electric heater group pending a physical check by a human operator. This has the advantage that the equipment the process equipment heating system is used to heat may be kept warm so that it does not cool down so that the possibility of explosive or corrosive media condensing on walls of the equipment may be avoided. Thus, as illustrated by FIG. 6, in some embodiments a method of operating a process equipment heating system 410, a heating system controller may judge that an electric heater group is faulty 412 and create an alert 414 so that a human operator is made aware that there is a potential fault that should be investigated. The fault detection may be by the methods disclosed herein, for example with reference to FIG. 1 or 2, or by monitoring temperature readings provided by temperature sensing transducers such as the transducers 254-270 shown in FIG. 3. The heating system controller does not react conventionally to the judging of a fault condition by causing the supply of electrical energy to the electric heater group to be interrupted, but instead defaults to maintaining an on condition 416 for the electric heater group, potentially including any faulty electric heater, so that the electric heater group, including any faulty heater in the group, continues to heat 418 the equipment it is supposed to be heating. The respective temperature sensitive device, or temperature devices, of the individual electric heaters in the electric heater group then become responsible 420 for protecting the processing equipment, or the electric heater, itself against damage due to thermal runaway and provided a predetermined temperature is not exceeded, the electric heaters in the electric heater group continue to output heat 418. If a temperature sensitive device is exposed to a temperature exceeding a predetermined temperature, it operates 422 to cut off the supply of electrical energy through the heating element, or heating elements, of the respective electric heater, effectively switching the electric heater off until such time as a human operator causes the electric heater to be brought back into use.

In embodiments in which the electric heaters have one or more temperature sensitive devices that interrupt the supply of electrical energy through the electric heater when exposed to a temperature in excess of a predetermined temperature, when a fault condition is judged for an electric heater group the heating system controller may default to maintaining the electrical supply to the electric heater group and rely on the temperature sensitive devices to protect against thermal runaway so that the components a fault electric heater heats are protected from exposure to damaging levels of heat while the problems of condensation on the walls of the equipment avoided, or at least reduced.

Many modifications and variations of the invention as hereinbefore set forth can be made without departing from the spirit and scope thereof, and, therefore, only such limitations should be imposed as are indicated by the appended claims.

What is claimed:

1. A method of detecting which of a plurality of groups of electric heaters in a process equipment heating system contains a failed electric heater, said method comprising operating a heating system controller to:
   use a phase selector to select one phase of a multi-phase power supply;
   measure the voltage of the selected phase;
   set a plurality of switching relays connected to the selected phase so that only a single group of electric heaters is connected to the selected phase while a second plurality of groups of electric heaters is connected to a second phase of the multi-phase power supply;
   determine a resistance value $R_1$ for the single group of electric heaters connected to the selected phase;
   compare said resistance value $R_1$ with a reference resistance value $R_R$; and
   (c) judge a fault condition if said resistance value $R_1$ differs from said reference resistance value $R_R$ by more than a predetermined amount.

2. The method of claim 1, wherein determining said resistance value $R_1$ comprises:
   obtaining an amperage measurement for the selected phase and
   using the voltage measurement and the amperage measurement to determine the resistance value $R_1$.

3. A method of detecting heater failure in a group of electric heaters as claimed in claim 1, further comprising storing said determined resistance value $R_1$ as the reference resistance value $R_R$ for a comparison with a next determined resistance value.

4. A process equipment heating system comprising:
   a first plurality of groups of electric heaters, where each group in the first plurality is connected to a first phase of a power supply by a respective relay;
   a second plurality of groups of electric heaters, where each group in the second plurality is connected to a second phase of the power supply by a respective relay; and
   a heater checking system comprising:
   a phase selector for selecting between the first phase and the second phase;
   at least one sensing transducer for sensing at least one value of the selected phase; and
   a controller configured to:
      activate the phase selector to select the first phase;
      set the relays between the first plurality of groups of heaters and the first phase of the power supply such that only a single group of heaters is connected to the first phase of the power supply;
      set the relays between the second plurality of groups of heaters and the second phase of the power supply such that every group in the second plurality of groups of heaters is connected to the second phase of the power supply; and
      determine a resistance value $R_1$ for the single group of electric heaters connected to the first phase of the power supply using the at least one sensing transducer, compare said resistance value $R_1$ with a reference resistance value $R_R$ and judge a fault condition in the single group of electric heaters if said resistance value $R_1$ differs from said reference resistance value $R_R$ by more than a predetermined amount.

5. A process equipment heating system as claimed in claim 4, wherein the at least one sensing transducer provides at least one of an amperage, voltage or wattage measurement for the selected phase.

6. A process equipment heating system as claimed in claim 4, wherein said checking system is configured to cause storing of said determined resistance value $R_1$ as an updated reference resistance value $R_R$ for use in place of said reference resistance value $R_R$.

* * * * *